United States Patent [19]

Kurata et al.

[11] Patent Number: 5,378,984
[45] Date of Patent: Jan. 3, 1995

[54] EB TYPE IC TESTER

[75] Inventors: Tsuguo Kurata, Isehara; Yasuyuki Hirai, Ohmiya, both of Japan

[73] Assignee: Advantest Corporation, Tokyo, Japan

[21] Appl. No.: 119,061

[22] PCT Filed: Jan. 20, 1993

[86] PCT No.: PCT/JP93/00061

§ 371 Date: Sep. 16, 1993

§ 102(e) Date: Sep. 16, 1993

[30] Foreign Application Priority Data

Jan. 20, 1992 [JP] Japan ................. 4-001481[U]

[51] Int. Cl.6 ............................................ G01R 31/26
[52] U.S. Cl. ............................. 324/751; 324/158.1; 324/73.1; 250/310; 250/311
[58] Field of Search .......... 324/158 R, 158 F, 73.1, 324/72.5; 250/310, 311

[56] References Cited

U.S. PATENT DOCUMENTS

| | | | |
|---|---|---|---|
| 3,997,807 | 12/1976 | Riddle | 250/311 |
| 4,632,624 | 12/1986 | Mirkovich | 414/217 |
| 4,816,754 | 3/1989 | Buechele | 324/158 P |
| 5,051,689 | 9/1991 | Hiwada | 324/158 P |
| 5,057,689 | 10/1991 | Nomura | 250/310 |
| 5,216,360 | 6/1993 | Gelzer | 324/158 F |

FOREIGN PATENT DOCUMENTS

| | | |
|---|---|---|
| 59-184453 | 12/1984 | Japan . |
| 1-229984 | 9/1989 | Japan . |
| 3-123878 | 5/1991 | Japan . |

Primary Examiner—Kenneth A. Wieder
Assistant Examiner—Mark A. Wardas
Attorney, Agent, or Firm—Staas & Halsey

[57] ABSTRACT

An electron beam emitting face (11) is exposed downward through a round hole (22) made in a support table (20) on which an electron beam irradiation unit (10) is mounted. Below the electron beam emitting face (11) a bottomed cylindrical member (60) is disposed on a performance board (24) mounted on a test head (40) with an opening of the bottomed cylindrical member facing the electron beam emitting face. A ring-shaped circuit board (53) is mounted on the upper end of the bottomed cylindrical member (60) and a ring-shaped airtight coupling mechanism (70) is provided, with the ring-shaped circuit board held between it and the bottomed cylindrical member. The ring-shaped airtight coupling mechanism (70) is airtightly connected to the support table to hold vacuous a space opposite the electron beam emitting face and the inside of the bottomed cylindrical member (60). A support plate (51) held along its marginal portion by the ring-shaped airtight coupling mechanism (70) is provided and an IC socket (52) for receiving an IC under test is mounted on the support plate. On part of the ring-shaped circuit board (53) inside the bottomed cylindrical member (60) there are a plurality of elastic contactors (53A) are connected to wiring of the support plate (51). The elastic contactors (53A) are led out to the outside of the bottomed cylindrical member (60) via wiring of the ring-shaped circuit board (53) and connected via coaxial cables (53C) to wiring of the performance board (25).

5 Claims, 6 Drawing Sheets

EB TYPE IC TESTER

TECHNICAL FIELD

The present invention relates to an EB type (Electron Beam type) IC tester which irradiates the chip surface of an IC under test with an electron beam, measures the quantity of secondary electrons emitted from conductors of an integrated circuit formed on the chip surface, displays the potential distribution in the integrated circuit as an image on a monitor on the basis of the measured quantity of secondary electrons, and locates failures or make a failure analysis through utilization of the potential distribution being displayed on the monitor.

BACKGROUND ART

FIG. 6 shows the general construction of a conventional EB type IC tester. Reference numeral 10 denotes an electron beam irradiation unit. The electron beam irradiation unit 10 is provided with a vacuum vessel called a body tube, in which an electron gun, an acceleration electrode, a focusing coil, a deflecting coil, etc. are mounted, though not shown, and an electron beam is emitted from the underside 11 of the electron beam irradiation unit. Accordingly, the underside 11 will hereinafter be referred to as an electron beam emitting face.

The electron beam irradiation unit 10 is mounted on a movably held support table 20. The support table 20 is pivotally secured to a column 30 in this example and hence is allowed to swivel about the column 30. By this swivel movement the electron beam irradiation unit 10 can be removed front its normal position just above a test head 40 forming the IC testor, enabling an IC under test to be loaded into and unloaded from an IC socket on a support plate 51 from above. The support table 20 is supported in such a manner that it is also movable up and down along the column 30. Incidentally, the electron beam irradiation unit 10 is loaded on an X-Y driving stage 12 on the support table 20 so that the point of irradiation by an electron beam can be moved in the X-Y direction.

The support table 20 has a cavity 21, which receives the electron beam emitting face 11 of the electron beam irradiation unit 10. In the bottom plate of the support table 20 there is made a round hole 22 opposite the electron beam emitting lace 11, and a cylindrical member 23A is received in the round hole for connecting the electron beam irradiation unit to the test head 40. The lower open end of the cylindrical member 23A is closed with an insulating plate 23B called a barrier board, by which the interiors of the cavity 21 and the cylindrical member 23A are hermetically sealed and kept vacuum.

An IC under test 50 is placed opposite the electron beam emitting face 11. The IC under test 50 is secured to the IC socket 52 (FIG. 1) mounted on the top of the support plate 51 centrally thereof. On the underside of the support plate 51 there are formed wiring conductors connected to respective terminals of the IC socket and extended radially for connection to contact pads provided at the marginal edges of the support plate 51, though not shown. Elastic contactors 53A, called "pogo pins" which are planted on a connection board 53 supported on the top of a column 54, are elastically urged against the contact pads.

The elastic contactors 53A on the connection board 53 and conductor pins 23C planted through the barrier board 23B are interconnected by impedance-matched cables 24 such as coaxial cables. The conductor pins 23C on the barrier board 23B and contact pads provided on a performance board 25, though not shown, are elastically interconnected by elastic contactors 55A planted on a connection board 55 and projecting out therefrom upward and downward, and the contact pads on the performance board 25 are connected to the test head 40. Thus the cylindrical member 23A and the support plate 51, the connection board 53, the column 54, etc. disposed inside the cylindrical member are supported on the performance board 25. The IC under test 50 is fitted into the IC socket from above after the support table 20 is disconnected from the cylindrical member 25A and turned away therefrom.

The inside of the cylindrical member 23A in which the coaxial cables 24 are disposed is evacuated; in general, however, the coaxial cable has a shortcoming that, when placed in a vacuum, it evolves gas and hence impairs the degree of vacuum in the cavity 21. Moreover, since the support table 20 and the test head 40 are mechanically connected by the cylindrical member 23A, vibration of a fan motor for air cooling, provided in the test head 40, for example, is introduced to the support table 20, and consequently, the position of irradiation by the electron beam oscillates, decreasing the resolution of the potential distribution image of the integrated circuit by the detected secondary electrons.

Furthermore, since the support table 20 is air-tightly connected to the top of the cylindrical member 23A and has its height fixed relative to the performance board 25, the height of the electron beam emitting face 11 relative to the support plate 51 is also fixed. As the result of this, the spacing Z (hereinafter referred to as a working distance) between the IC under test 50 and the electron beam emitting face 11 is fixed and cannot be adjusted. Accordingly, even if the thickness of the IC under test 50 and the thickness of the IC socket change, the working distance cannot be adjusted to maximize the resolution of the image by the detected secondary electrons, and hence the test cannot always be made under the condition of optimum resolution. Besides, the lower open end of the cylindrical member 22 is closed with the barrier board 23B but the hermetic seal by the barrier board 23A is not so reliable table.

A first object of the present invention is to provide an EB type IC tester which does not allow easy deterioration of the degree of vacuum of the electron beam emitting portion.

A second object of the present invention is to provide an EB type IC tester which attains the above-noted first object and permits adjustment of the working distance between the electron beam emitting face and the IC under test.

A third object of the present invention is to provide an EB type IC tester which attains the above-noted first object and does not allow easy transmission of vibration from the test head to the IC under test and the electron beam irradiation unit.

DISCLOSURE OF THE INVENTION

In the invention which attains the first object, a bottomed cylindrical member is provided which covers the electron beam emitting, face of the electron beam irradiation unit. The space deflated by the bottomed cylindrical member covering the electron beam emitting face is evacuated. The bottomed cylindrical member has in its body a seal portion, through which ring-shaped circuit board projects out from the inside of the bottomed cylindrical member. The ring-shaped circuit board inside the bottomed cylindrical member has planted thereon many elastic contactors, which contact the contact pads formed on the support plate, thus electrically leading terminals of the IC under test on the support plate to the outside of the bottomed cylindrical member through the ring-shaped circuit board. The terminals of the IC under test, electrically led out of the bottomed cylindrical member through the circuit board, are connected by cables to the performance board.

Accordingly, in this structure the cables for electrically interconnecting the support plate and the performance board need not be placed in a vacuum, and hence no gas is evolved from the cables in the vacuum this obviates the defect of the degree of vacuum of the electron beam emitting portion being detriorated.

In the EB type IC tester of the present invention which attains the second object, the performance board is elastically urged against the bottom of the bottomed cylindrical member to interconnect the test head and the electron beam irradiation unit. This coupling structure provides a characteristic that vibration is hard to be transmitted between the test head and the electron beam irradiation unit. Hence it is possible to improve the resolution of the image by the detected secondary electrons.

In the invention which attains the third object, working distance adjustment means is provided by which the bottomed cylindrical member is moved up and down. By moving the bottomed cylindrical member in the vertical direction by the working distance adjustment means, the support plate is also moved up and down together with the bottomed cylindrical member. As the result of this, the IC under test can be brought toward or away from the electron beam emitting face; so that even if the thickness of the IC under test or the thickness of the IC socket changes, the working distance Z can always be set as desired. This provides an advantage that the IC test can always be made with optimum resolution.

BEST MODE FOR CARRYING OUT THE INVENTION

Figure 1:
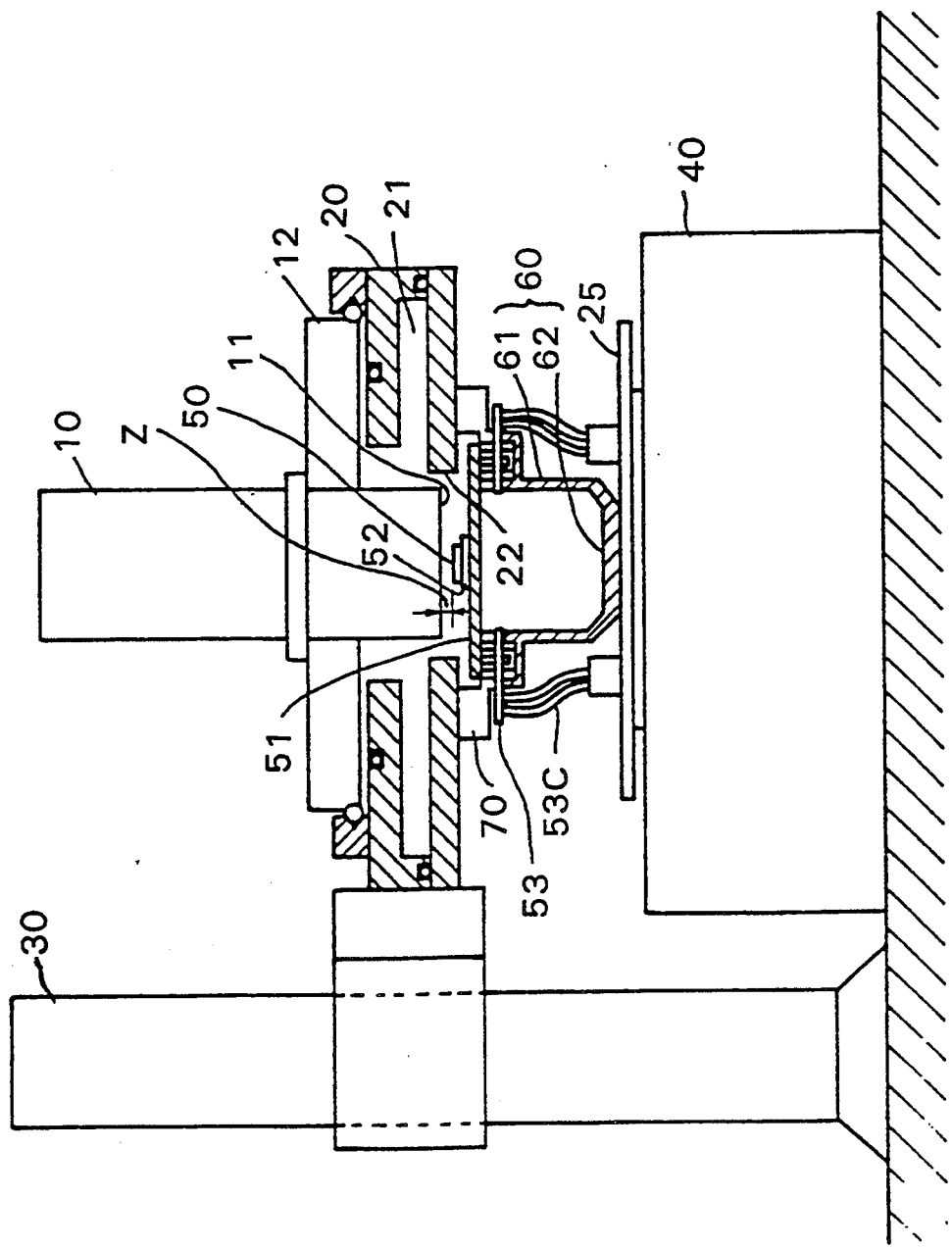
FIG. 1 is a side view illustrating an embodiment of the present invention.
Figure 2:
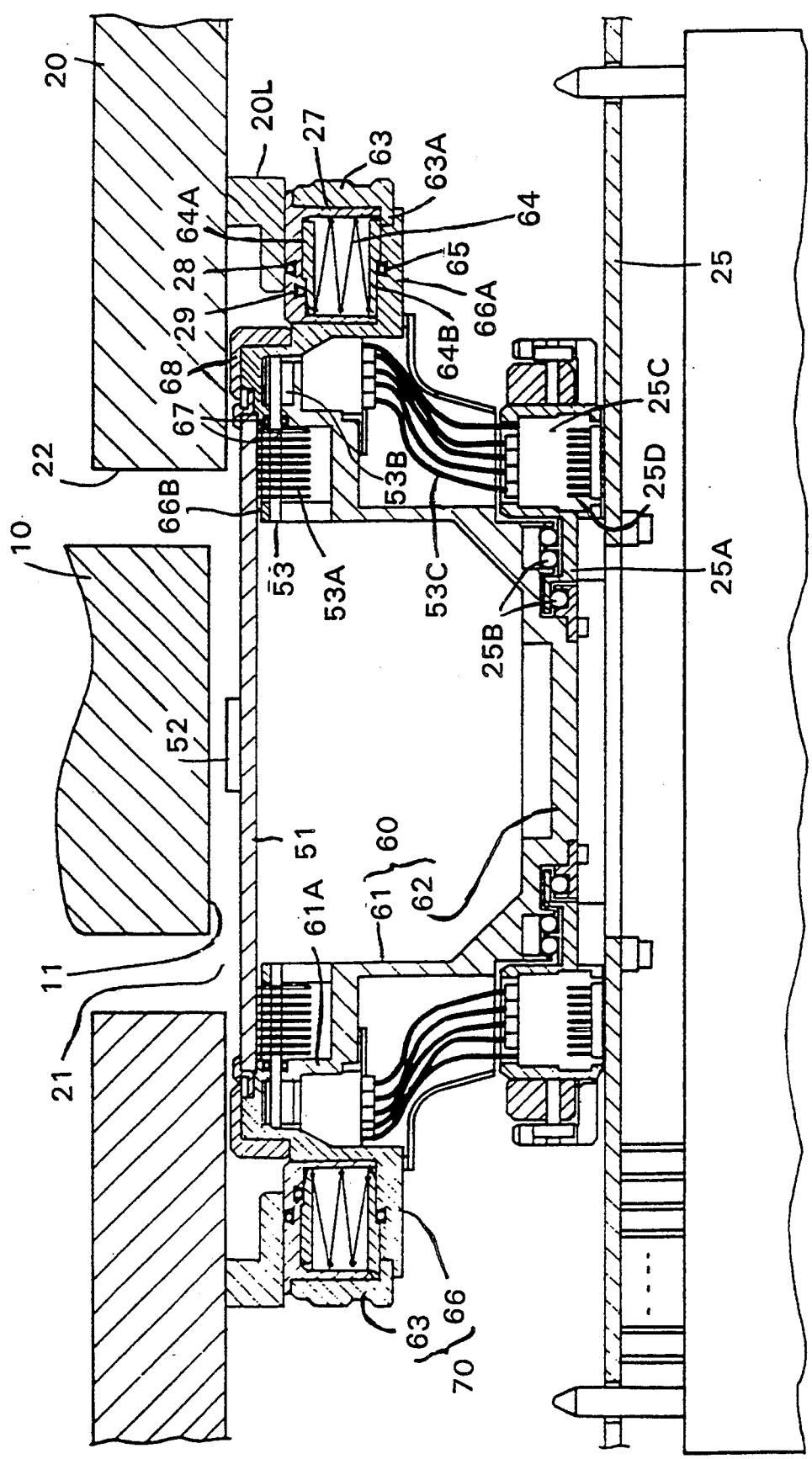
FIG. 2 is an enlarged sectional view for explaining the construction of the principal part of the FIG. 1 embodiment.

FIG. 1 illustrates, in a simplified form, the entire structure of the EB type IC tester according to the present invention and FIG. 2 illustrates, in more detail, its principal part on an enlarged scale. Reference numeral 10 denotes an electron beam irradiation unit and 20 a support table which supports the electron beam irradiation unit 10. The support table 20 is rotatably secured to a column 30 and provision is made for adjusting the position of the support table 20 by moving it in the vertical direction by means off vertical position adjustment mechanism provided on the column 30. Accordingly, the electron beam irradiation unit 10 can be ejected from its position above the support plate 51 as required. Of course, the column 30 and the vertical position adjustment means provided thereon need only to be capable of changing the relative distance between the electron beam irradiation unit 10 and the test head 40; hence, it is also possible to employ a construction in which the electron beam irradiation unit 10 is fixed and the test head 40 side is movably secured to the column.

The support table 20 has a centrally-disposed round hole 22, which receives the top end portion of the electron beam irradiation unit 10, that is, the electron beam emitting face 11. The space surrounding and opposing the electron beam emitting face 11 is a cavity 21 that is evacuated by an evacuator not shown. A bottomed cylindrical member 60 is disposed in a manner to close the round hole 22. The bottomed cylindrical member 60 has a construction in which a cylindrical member 61 has its lower open end is bottomed or closed as indicated by 62. A performance board 25 is attached to the underside of the bottomed cylindrical member 60 with an elastic member interposed therebetween as described later. The bottomed cylindrical member 60 and the support table 20 are coupled together by an airtight coupling mechanism 70 so as to keep the cavity 21 and the inside of the bottomed cylindrical member 60 evacuated. In the present invention, as depicted in detail in FIG. 2, the airtight coupling mechanism 70 has a working distance adjustment mechanism which connects the support table 20 to the bottomed cylindrical member 60 in a manner to be movable in the vertical direction and shifts the position of the IC under test 50 relative to the electron beam emitting face 11, thereby adjusting the working distance Z.

As shown in FIG. 2, the airtight coupling mechanism 70 is made up of an externally-threaded ring 27 having an inverted U-shaped cross-section, a ring-shaped nut 63 threadedly engaged therewith, ring-shaped welded bellows housed in the U-shaped groove of the externally-threaded ring 27, and a hat member 66 having a brim 66A which carries the externally-threaded ring 27 and the bellows 64.

Between the underside of a ring member 20L of an L-shaped cross-section, airtightly secured to the underside of the support table 20, and the externally-threaded ring 27 there is interposed an 0 ring 28 to couple them airtightly. The ring-shaped welded bellows 64 is housed in the U-shaped groove of the externally-threaded ring 27. As is well-known in the art, the welded bellows 64 is made by welding together springy band-shaped rings with their outer and inner sides alternate with each other and welding fixing ring plates 64A and 64B to upper and lower end sides of the welded ring assembly. The upper fixing ring plate 64A is pressed against the externally-threaded ring 27 with an 0 ring 29 interposed therebetween, whereas the lower fixing ring plate 64B is pressed against the brim 66A of the hat member 66 with an 0 ring 65 interposed therebetween In the ceiling of the hat member 66 there is made a hole of about the same diameter as that of the cylindrical portion 61 to form an inwardly projecting flange 66B. The cylindrical portion 61 of the bottomed cylindrical member 60 has the diameter of its upper open end portion enlarged to form an enlarged-diameter portion 61A, and a ring-shaped circuit board 53 is held between the upper marginal edge of the above-mentioned enlarged-diameter portion and the flange 66B of the hat member 66, their connecting portion being held airtight by a sealing member 67. With such a construction, the inside of the bottomed cylindrical member 60 and the cavity portion 21 are hermetically sealed against the outside and can be evacuated.

The ring-shaped nut 63 has a protrusion 63A on the inside of its lower marginal portion, and the protrusion 63A makes rotatable, sliding contact with the top of the marginal portion of the brim 66A to form the working distance adjustment mechanism. Turning the ring-shaped nut 63, the male-screw ring 27 moves up or down. Following the movement of the ring 27, the support table 20 also moves up or down. At this time, the fixing ring 64B slides up and down in the U-shaped groove of the male-screw ring 27, expanding and contracting the welded bellows 64. In the case where the test head 40 is placed at a distance from the performance board 25 and connected thereto via a cable, the bottomed cylindrical member 60 moves up or down by turning the ring-shaped nut 63.

The support plate 51 is mounted on the flange 66B of the hat member 66 and its marginal portion is fixed by a ring 68 of an L-shaped cross-section, with an elastic member interposed therebetween. The support plate 51 is a multilayer interconnection board and respective terminals of the IC socket 52 mounted on the plate 51 centrally thereof are connected to interconnection conductors laminated in layers, though not shown. The interconnection conductors are extended to the marginal portion of the support plate 51, where they are led to the underside thereof through holes for connection to contact pads formed on the underside of the support plate 51.

On the ring-shaped circuit board 53 inside the enlarged-diameter portion 61A there are planted elastic contactors 53A called "pogo pins," and elastic contacts of the elastic contactors 53A make contact with the above-mentioned contact pads formed on the underside of the support plate 51, thus connecting the respective terminals of the IC socket 52 to the ring-shaped circuit board 53. The ring-shaped circuit board 53 is also a multilayer interconnection board. The elastic contactors 53A are led out to the outer periphery side of the ring-shaped circuit board 53, that is, to the outside of the bottomed cylindrical member 60 through the multilayer interconnection conductors. At the outer periphery side of the ring-shaped circuit board 53 there is provided a socket 53B, through which a plurality of coaxial cables 53C are connected. The coaxial cables 53C are connected via printed wiring of a printed board 25C to elastic contactors 25D mounted on the side thereof. The elastic contactors 25D are connected to contact pads (not shown) formed on the top of the perfomance board 25, from which they are connected to the test head 40 via printd wiring on the performance board 25.

With such a construction as described above, the coaxial cables 53C need not be disposed in a vacuum. As the result of this, it is possible to obviate the defect that the degree of vacuum is decreased by gas which would otherwise be evolved from the coaxial cables.

Moreover, according to the present invention, a vibration proof mechanism is provided between the bottomed cylindrcal member 60 and the performance board 25 to reduce vibration that is transmitted from the test head 40 to the bottomed cylndrical member 60. That is, a ring-shaped flange 25A is provided on the performance board 25 and the flange 25A is urged against the bottom of the bottomed cylindrical member 60 with elastic members 25B interposed therebetween. The elastic members 25B can be formed by ring-shaped rubber members or springs disposed at some points in the circumferential direction.

With the elastic members 25B interposed between the performance board 25 and the bottomed cylindrical member 60 as mentioned above, vibration of a fan motor or the like that is transmitted from the test head 40 to the bottomed cylindrical member 60 is reduced, and hence variations in the position of irradiation by the electron beam, by the above-noted vibration, can be decreased. Thus, the position of irradiation by the electron beam is stabilized—this improves resolution of the image that is reproduced by secondary electrons.

Figure 3:
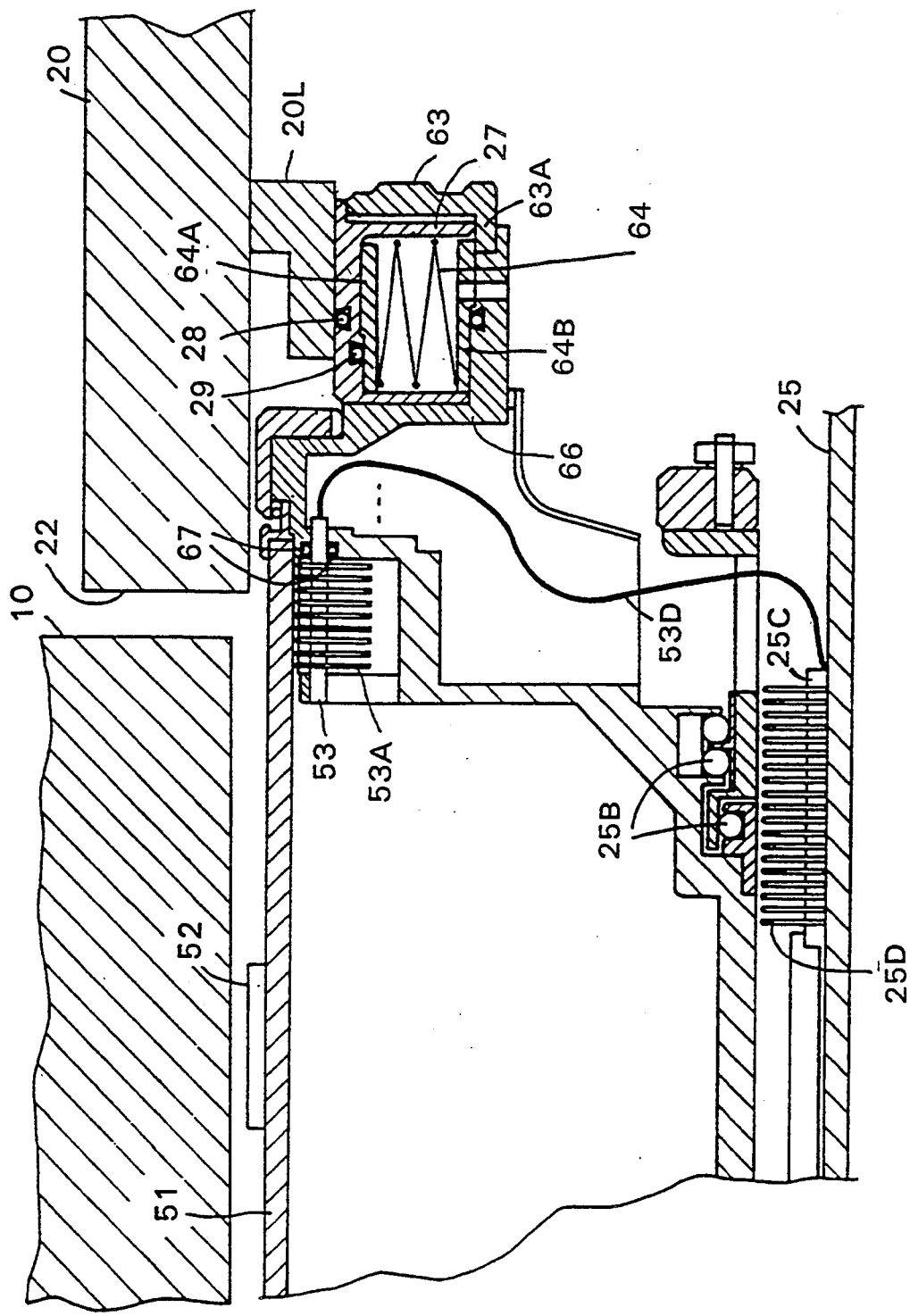
FIG. 3 is a sectional view for explaining a modified form of the present invention.
Figure 4:
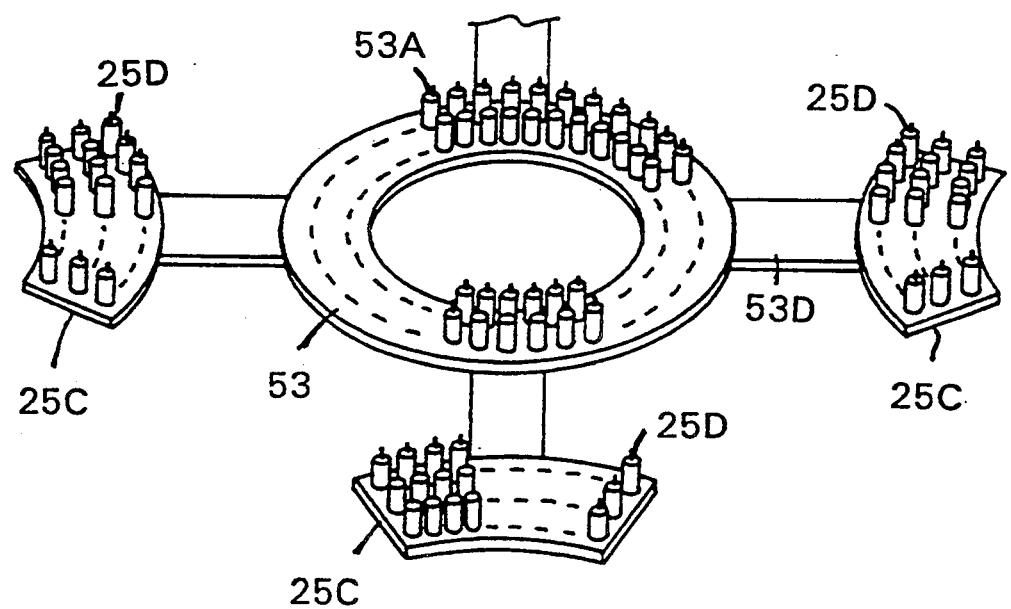
FIG. 4 is a perspective view showing, by way of example, the constructions of a ring-shaped circuit board and a flat type flexible cable for use in the modified form of the present invention.

FIG. 3 illustrates a modified form of the present invention, in which the parts corresponding to those in FIG. 2 are identified by the same reference numerals. In this embodiment the ring-shaped circuit board 53 and the performance board 25 are shown to be connected by flat type flexible cables 53D. That is, as shown in FIG. 4, the flat type flexible cables 53D are led out radially of the ring-shaped circuit board 53. In this example, four flat type flexible cables 53D are shown to protrude from the periphery of the ring-shaped circuit board 53. Each flat type flexible cable 53B carries at its tip an arcuate printed circuit board 25C, which has elastic contactors 25D planted hereon. The ring-shaped circuit board 53 is held between the upper marginal edge of the enlarged-diameter portion 61A of the bottomed cylindrical member 60 and the flange 66B of the hat member 66, as in the FIG. 3 embodiment, by which the elastic contactors 53A planted on the circuit board 53 are connected to the contact pads formed on the underside of the support plate 51. The elastic contactors 53A of the rings-shaped circuit board 53 are connected via the flat flexible cables 53D to the elastic contactors 25D of the arcuate printed circuit boards 25C. The arcuate printed circuit boards 25C are pressed against the performance board 25 as shown in FIG. 3, bringing the elastic contactors 25D into contact with the contact pads on the performance board 25.

The multilayer interconnections of the flat type flexible cables 53D and the support plate 51 can be matched to a specific impedance by employing therefor a microstrip line structure, for instance. Hence, even when the flat type flexible cables 53D are used, the impedance of the respective line from the IC socket 52 mounted on the support plate 51 to the test head 40 can be matched to a specific impedance.

Figure 5:
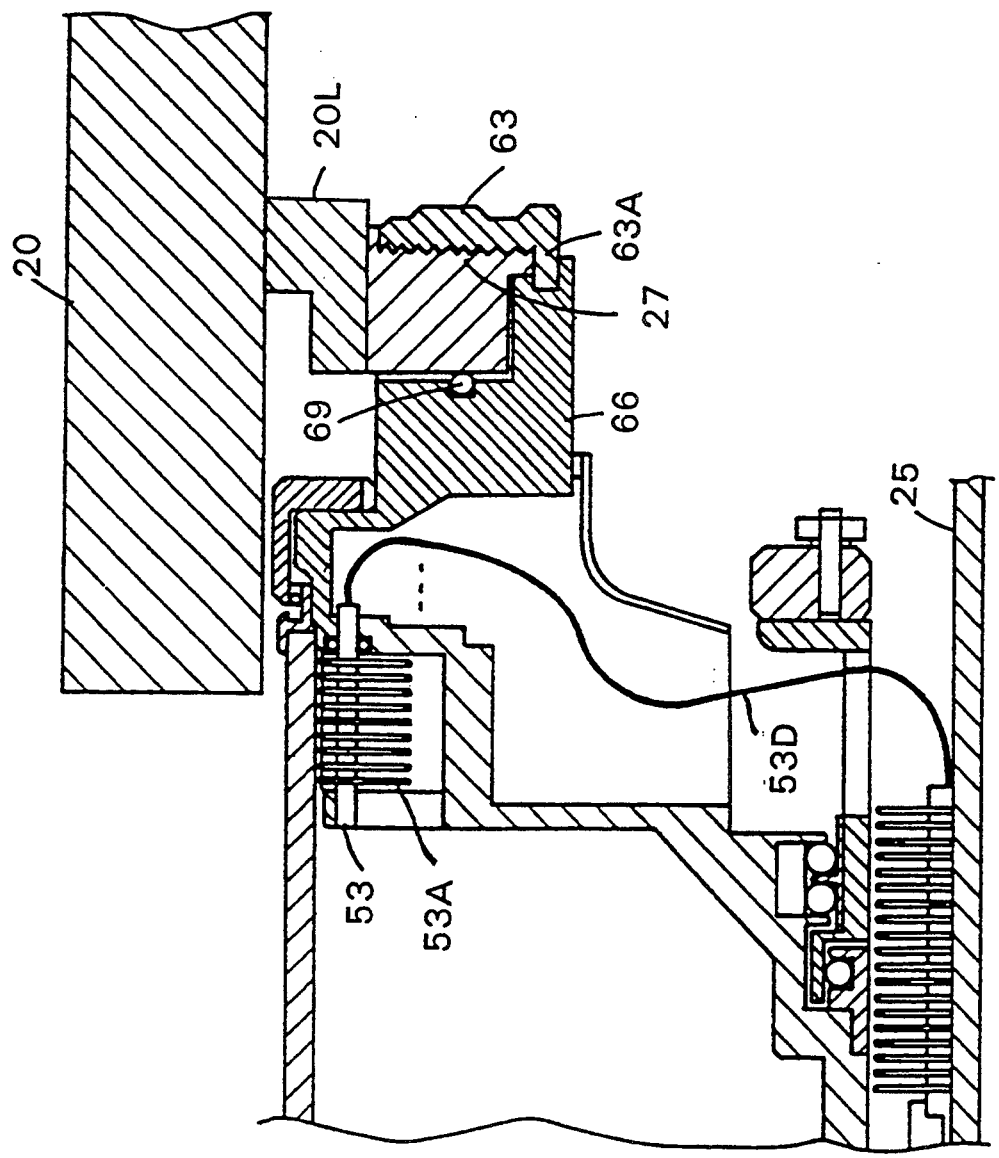
FIG. 5 is an enlarged sectional view illustrating another modification of the present invention.
Figure 6:
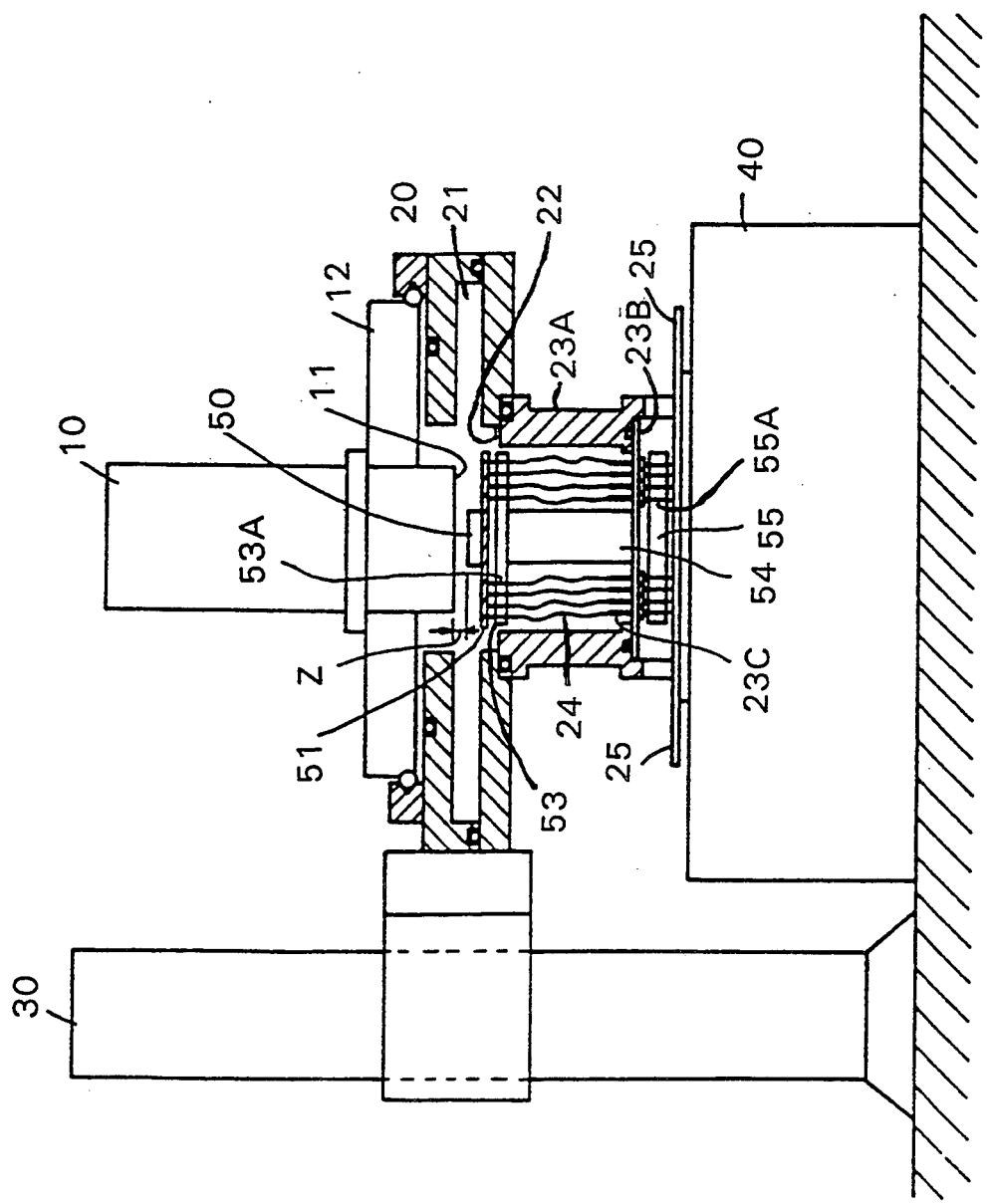
FIG. 6 is a sectional view for explaining the prior art.

FIG. 5 illustrates a modification of the movable seaing portion in the present invention. This example shows the case of using an 0 ring 69 in place of the welded bellows. That is, it is also possible to employ a construction in which the 0 ring 69 is inserted in the sliding surface of the bottomed cylindrical member 60 between it and the ring-shaped male screw 27 to hermetically seal off the inside of the bottomed cylindrical member 60 and the cavity portion 21 from the open air.

As described above, according to the present invention, since the coaxial cables 53C, which are used to electrically connect the IC socket 52 mounted on the support plate 51 and the performance board 25, are disposed outside of the vacuum portion, there is no possibility of the degree of vacuum being degraded by gas which would otherwise be evolved from the coaxial cables 53C.

In addition, since provision is made for moving the bottomed cylindrical member 60 in the vertical direction, the gap between the IC under test 50 and the electron beam emitting face 11, that is, the working distance Z can be adjusted. Hence, the working distance Z can be set to an optimum value through adjustment while in operation. The adjustability of the working distance Z permits higher grade tests of ICs.

Moreover, according to the present invention, since the elastic members 25B are interposed between the performance board 25 and the bottomed cylindrical member 60, it is possible to decrease the quantity of vibration which is transmitted from the test head 40 to the bottomed cylindrical member 60 and the support table 20. This reduces the variation in the position of irradiation by the electron beam, and hence improves the resolution, providing for enhanced accuracy in IC tests as a whole.

We claim:

1. An EB type IC tester comprising:

an electron beam irradiation unit mounted on a support table and having an electron beam emitting face inserted in an opening made in said support table centrally thereof;

a performance board having wiring electrically connected to a test head;

a bottomed cylindrical member disposed on said performance board and having an upper open end;

a ring-shaped circuit board mounted on the upper end face of said bottomed cylindrical member, having mounted thereon a plurality of elastic contactors inside said bottomed cylindrical member in its radial direction and having printed wiring connected to said elastic contactors and led out to the outside of said bottomed cylindrical member in its radial direction;

annular airtight coupling means whereby said ring-shaped circuit board is airtightly held between it and said upper end face of said bottomed cylindrical member and said electron beam emitting face, disposed opposite the upper end face of said bottomed cylindrical member, is airtightly connected to the underside of said support table to thereby form an airtight space facing said electron beam emitting face;

a support plate held along its marginal portion by said annular airtight coupling means in said airtight space, said support plate having on the underside of its marginal portion contact pads against which said elastic contactors of said ring-shaped circuit board are pressed, an IC socket mounted on its top surface centrally thereof for receiving an IC under test and wiring for connecting respective terminals of said IC socket to the corresponding ones of said contact pads; and electrical connection means extending outside said bottomed cylindrical member, for connecting wiring of said ring-shaped circuit board, led out to the outside of said bottomed cylindrical member, to wiring of said performance board.

2. The EB type IC tester of claim 1, wherein said airtight coupling means includes working distance adjustment means interposed between said support table and said bottomed cylindrical member, for bringing said bottomed cylindrical member toward or away from said electron beam emitting face while holding said cylindrical member and said electron beam emitting face in an airtight state.

3. The EB type IC tester of claim 1, wherein said bottomed cylindrical member has its lower end portion resting on said performance board with elastic support means interposed therebetween.

4. The EB type IC tester of claim 1, wherein said electrical connection means includes a plurality of coaxial cables.

5. The EB type IC tester of claim 1, wherein said electrical connection means includes flat type flexible cables each having a plurality of wiring conductors.

* * * * *

UNITED STATES PATENT AND TRADEMARK OFFICE
CERTIFICATE OF CORRECTION

PATENT NO. : 5,378,984
DATED : January 3, 1995
INVENTOR(S) : T. KURATA et al

It is certified that error appears in the above-indentified patent and that said Letters Patent is hereby corrected as shown below:

Title Page [57], line 23, delete "are" after "(53A)".

Column 1, line 33, delete "front" and insert --from--.

Column 2, line 45, delete "table".

Column 3, line 16, insert -- -- -- after "vacuum".

Column 4, line 62, insert --.-- after "therebetween".

Column 6, line 17, delete "-" and insert -- -- --.

UNITED STATES PATENT AND TRADEMARK OFFICE
CERTIFICATE OF CORRECTION

PATENT NO. : 5,378,984
DATED : January 3, 1995
INVENTOR(S) : T. KURATA et al

It is certified that error appears in the above-indentified patent and that said Letters Patent is hereby corrected as shown below:

Column 6, line 55, delete "seaing" and insert --sealing--.

Signed and Sealed this

Eleventh Day of April, 1995

Attest:

BRUCE LEHMAN

*Attesting Officer*     *Commissioner of Patents and Trademarks*